United States Patent [19]

Brolde

[11] 4,147,989

[45] Apr. 3, 1979

[54] NON-LINEAR DIRECT-CURRENT AMPLIFIER FOR MEASURING PURPOSES

[75] Inventor: Kurt Brolde, Lörrach, Fed. Rep. of Germany

[73] Assignee: Endress & Hauser GmbH & Co., Maulburg, Fed. Rep. of Germany

[21] Appl. No.: 794,500

[22] Filed: May 6, 1977

[30] Foreign Application Priority Data

May 7, 1976 [DE] Fed. Rep. of Germany ....... 2620282

[51] Int. Cl.² .............................................. G06G 7/12
[52] U.S. Cl. ................................... 328/142; 330/110; 364/852
[58] Field of Search ................. 330/110; 307/229, 330; 328/142, 144, 145; 364/851, 852, 853, 854, 857, 859

[56] References Cited

U.S. PATENT DOCUMENTS

| | | | |
|---|---|---|---|
| 3,209,266 | 9/1965 | White | 307/229 X |
| 3,371,224 | 2/1968 | Polo | 307/230 X |
| 3,514,635 | 5/1970 | Gilbert | 328/142 X |
| 3,525,942 | 8/1970 | Boronkay et al. | 328/142 |
| 3,550,020 | 12/1970 | Gill et al. | 328/142 |
| 3,739,196 | 6/1973 | Tavis | 326/229 |

OTHER PUBLICATIONS

Rodriguez-Izquierdo et al., "High Gain Integrated Amplifiers Stabilize Function Generators", *Annales de L'Association Internationale Pour le Calcul Analogique*, No. 4, vol. 13, Oct. 1971, pp. 156–159.

Primary Examiner—James B. Mullins
Attorney, Agent, or Firm—Pollock, Vande Sande & Priddy

[57] ABSTRACT

A non-linear direct-current amplifier in particular for linearizing the output characteristic of a measuring transducer, comprising a main amplifier of which the overall gain is determined by means of one or more non-linear operational amplifier elements of which the individual outputs are connected by way of respective summing resistors with the input of the main amplifier, the input of each operational amplifier element being connected with the tapping of a resistive voltage divider connected between the output of the main amplifier and a reference potential source. Depending on the construction and connection of the operational amplifier elements, amplifier characteristics having increasing, decreasing or both types of slopes can be approximated by rectilinear sections.

13 Claims, 8 Drawing Figures

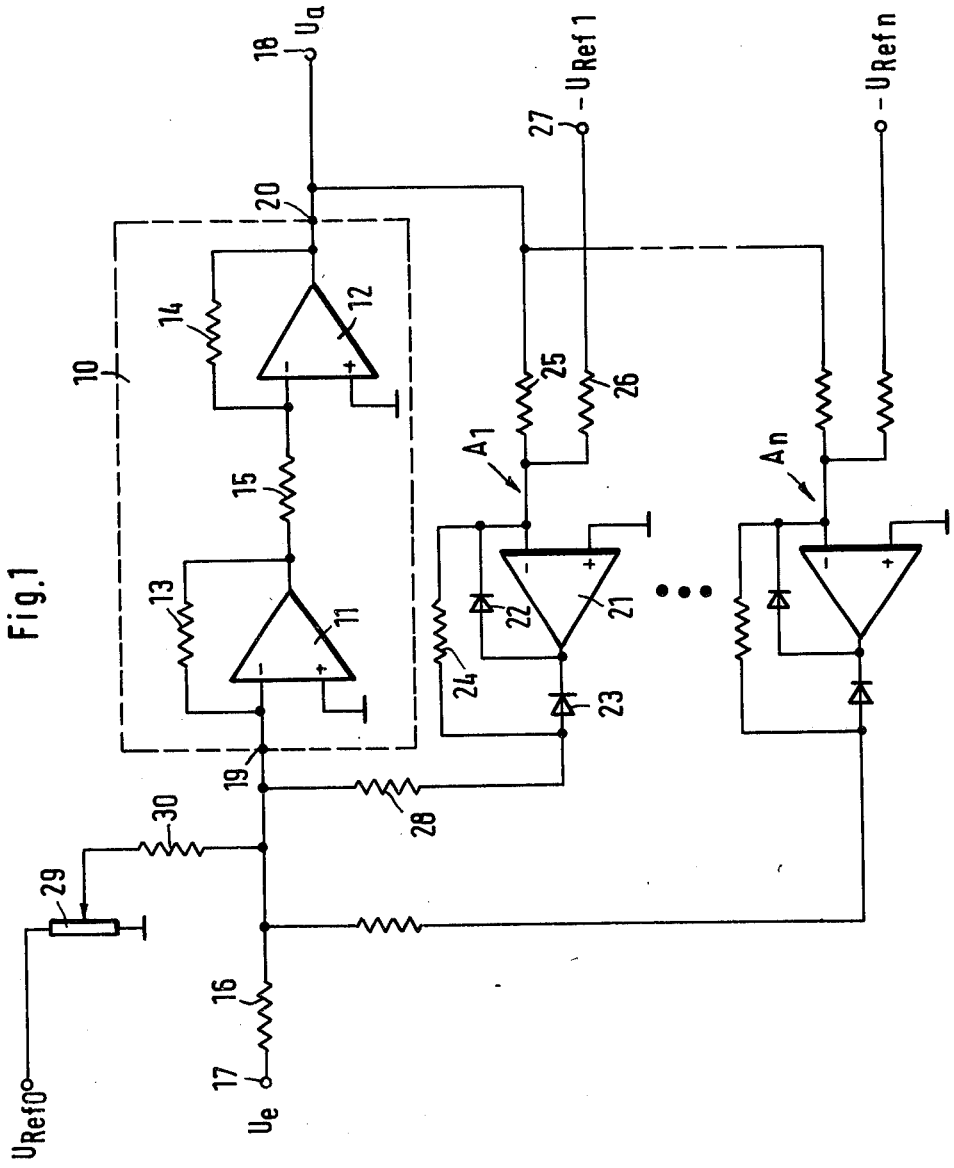

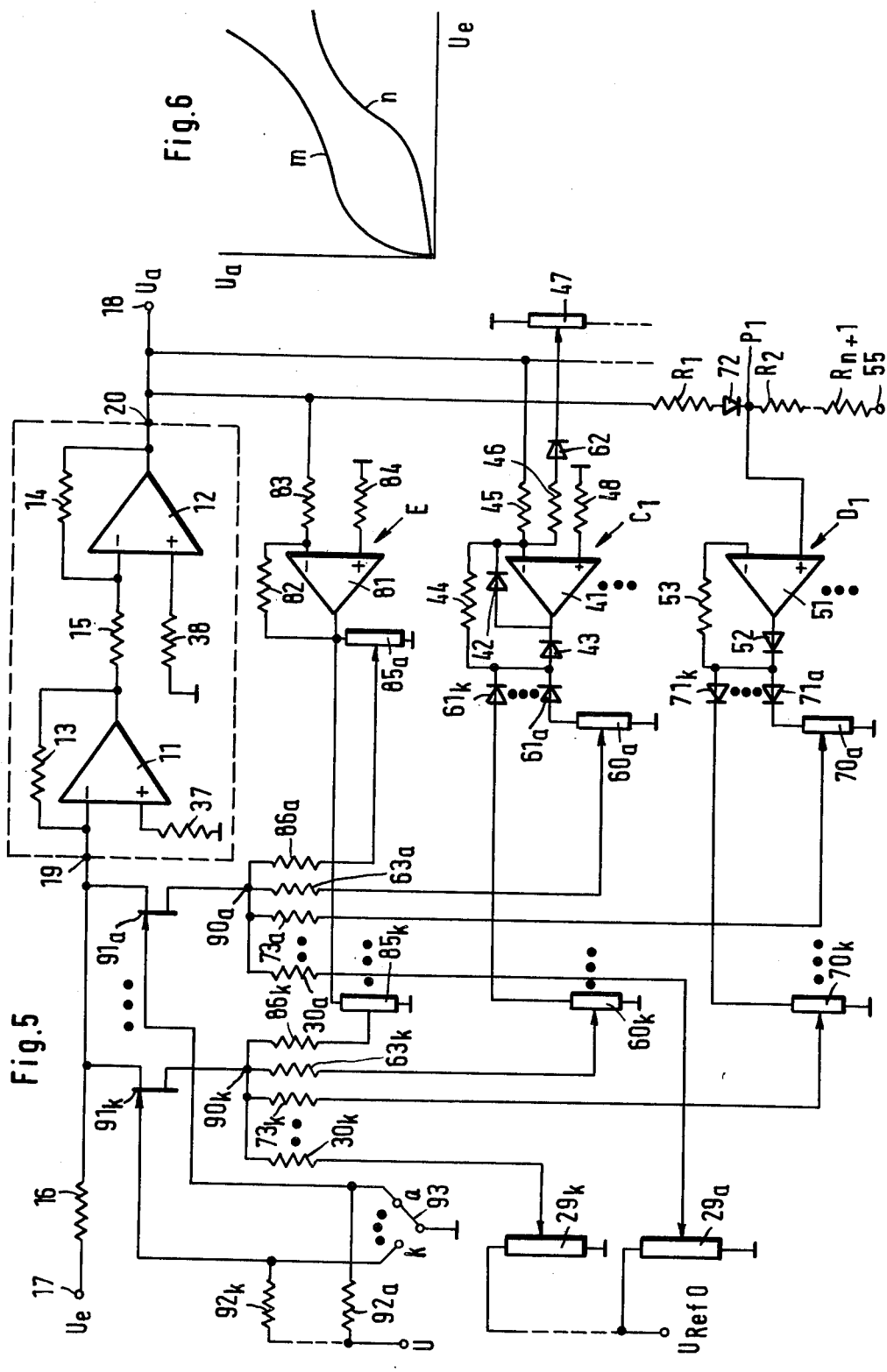

NON-LINEAR DIRECT-CURRENT AMPLIFIER FOR MEASURING PURPOSES

This invention relates to a non-linear direct-current amplifier for measuring purposes, including a main amplifier, arranged to be connected to a measuring transducer, the overall gain of which is determined by one or more non-linearly constructed operational amplifier units, the outputs of which are connected by way of a summing resistor with the input of the main amplifier and the thresholds of which correspond to different values of the measured value.

Measuring transducers, which are employed to convert an arbitrary physical quantity into an electrical signal (voltage or current), are in most cases non-linear, that is, the electrical signal developed is not proportional to the measured quantity. The relation between the measured quantity and the electrical signal developed by the measuring transducer is expressed by the calibration curve of the measuring transducer. This calibration curve is different for the different kinds of measuring transducers. Even for measuring transducers of the same kind the calibration curves differ because of the unavoidable spread between samples resulting from offset-factors or sensitivity factors specific to the samples. For many applications, especially for indicating the measured quantity on a linear display means, proportionality between the measured physical quantity and the electrical signal must be present. For this purpose it is known to connect, following the measuring transducer, a non-linear direct-current amplifier of which the characteristic is exactly inverse to the calibration curve of the transducer (an inverted or mirror function).

For this purpose there may be employed non-linear direct-current amplifiers of the kind initially mentioned, that are known for example from the "Handbook and Catalog of Operational Amplifiers" of the Burr-Brown Research Corporation, 1969, and also from the periodical "Internationale elektronische Rundschau" 1970, No. 10, pages 265 to 269, especially FIG. 8 on page 267, and are also designated as non-linear function generators. The mode of operation of those non-linear direct-current amplifiers depends upon the desired non-linear gain characteristic being approximated by rectilinear sections, the discontinuities corresponding to the threshold points of the non-linearly constructed operational amplifier elements. In these known non-linear direct-current amplifiers the inverting inputs of the operational amplifier elements, that are connected as precision rectifiers and therefore each display the characteristics of an ideal diode, are connected with the tappings of voltage dividers that are connected in parallel with each other between one input terminal and a reference potential source. The voltage division ratios of the voltage dividers are different. When the output signal of the measuring transducer is applied to the signal input the operational amplifier units become transmissive at different values of the input signal, in accordance with the voltage division ratios, so that a current dependent upon the value of the summing resistance is supplied to the summing point at the amplifier input. The gain characteristic of the main amplifier formed by a negative-feedback operational amplifier is thus determined.

When these known non-linear direct-current amplifiers are employed for linearising the calibration curves of measuring transducers, the thresholds of the non-linear operational amplifier elements, and thus the discontinuities in the amplifier characteristic, are determined by definite values of the output signal of the measuring transducer, that stands in a non-linear relation to the measured value. Now when the calibration curve of a particular transducer is falsified by an offset factor, the amplifier characteristic referred to the measured value is also falsified. Offset correction by simple displacement of the amplifier characteristic is therefore impossible.

In a similar manner, offset and gain variations, which result from changes in electrical components of the non-linear amplifier itself, manifest themselves.

The disadvantages depicted above become the more obvious the greater is the curvature of the calibration curve and therefore that of the inverse amplifier characteristic. The construction of the non-linear amplifier then necessitates careful individual equalization so as to match it to the respective measuring transducer.

The object of the invention is to provide a non-linear direct-current amplifier of the kind initially set forth, which makes possible a close approximation even to sharply curved characteristics and simple matching to different measuring transducers.

According to the present invention there is provided a non-linear direct-current amplifier including a main amplifier of which the overall gain is determined by means of one or more non-linear operational amplifier elements of which the individual outputs are connected by way of respective summing resistors with the input of the main amplifier and the inputs are each connected with the tapping of a resistive voltage divider connected between the output of the main amplifier and a reference potential source.

In a non-linear direct-current (d.-c.) amplifier in accordance with the invention the thresholds of the operational amplifier elements are not determined by the output signal of the measuring transducer, but by the output signal of the main amplifier, that already has a substantially linear relation to the measured quantity. There thus results, especially when dealing with strongly curved characteristics, the advantage that alterations in offset and gain resulting in the non-linear operational amplifiers give rise to a substantially smaller error at the output of the main amplifier than in the known non-linear d.-c. amplifiers. Because the thresholds of the non-linear operational amplifier elements depend upon the output voltage of the main amplifier, that already has a relation to the measured quantity varying oppositely to the calibration curve, the reference voltages for the non-linear operational amplifier elements also always relate to the measured quantity. A calibration curve falsified by an offset factor can thus be linearized without altering the reference voltages, by applying to the summing point at the input of the main amplifier an offset current corresponding to the offset factor. This measure results in a displacement of the amplifier characteristic parallel to itself.

The main amplifier is preferably so constructed that its output signal alters in the same sense as its input signal. In accordance with a preferred embodiment of the invention this is arranged by the main amplifier containing two operational amplifiers, the inverting input of the first operational amplifier forming the input of the main amplifier, the output of the second operational amplifier forming the output of the main amplifier and the inverting input of the second operational amplifier being connected to the output of the first operational amplifier.

In an embodiment of the invention an individual voltage divider is provided for some at least of the operational amplifier elements, to the tapping of which the inverting input of the operational amplifier element is connected, and the voltage dividers are connected in parallel with one another between the output of the main amplifier and points in the circuit at different reference potentials.

This construction provides an amplifier characteristic of diminishing slope. Here each operational amplifier element is preferably constructed as a precision rectifier and the reference voltage of each voltage divider is preferably adjustable.

In another embodiment of the invention there is provided for some at least of the operational amplifier elements a voltage divider with several staggered tappings, connected between the output of the main amplifier and a circuit point at reference voltage, and the non-inverting inputs of the operational amplifier elements are connected to the tappings of the voltage divider.

This construction provides an amplifier characteristic of increasing slope.

The two arrangements can also be employed simultaneously, so that it is possible to obtain amplifier characteristics with points of inflexion.

In an advantageous extension of the invention a semiconductor diode is provided in each connection between the output of an operational amplifier element and the input of the main amplifier. A rounding-off of the discontinuities in the amplifier characteristic is thus produced.

The alteration in gain of the main amplifier may, in accordance with an advantageous embodiment of the invention, take place in a simple manner, by connecting the output of the main amplifier to the inverting input of a linear operational amplifier element, to the output of which there is connected a voltage divider of which the output is connected by way of a summing resistance with the input of the main amplifier.

In another embodiment there is connected to the output of each operational amplifier element at least one voltage divider of which the tapping is connected by way of a summing resistance with the input of the main amplifier. This arrangement provides a further possibility for adjustment of the amplifier characteristic.

In particular, the advantages obtained by the use of the invention make it possible to construct the non-linear d.-c. amplifier so that it may be changed over between different pre-set non-linear characteristics. In accordance with a preferred arrangement embodying the invention this may be effected by providing a plurality of voltage dividers connected to the output of each operational amplifier element, each tapping of a voltage divider being connected with one terminal of a summing resistance, the other terminals of the summing resistances being connected together in groups and the junction point of each group being selectively connectable by way of a switch to the input of the main amplifier. The switching is preferably effected by means of semiconductor switching devices, for example field-effect transistors.

Further preferred features and advantages of the invention will become apparent from the following description of exemplary embodiments, given with reference to the accompanying drawings, in which:

FIG. 1 shows a first embodiment of non-linear d.-c. amplifier in accordance with the invention;

FIG. 2 shows the input/output characteristic of the amplifier of FIG. 1;

FIG. 5 shows a non-linear d.-c. amplifier embodying the invention in which the embodiments of FIGS. 1 and 3 are combined;

FIG. 6 shows possible input/output characteristics of the amplifier of FIG. 5.

Figure 4:
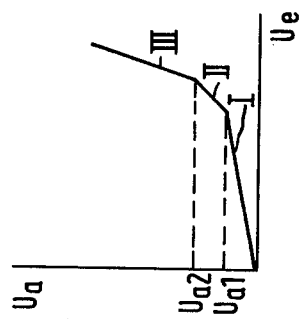
FIG. 4 shows the input/output characteristic of the amplifier of FIG. 3.

The non-linear d.-c. amplifier represented in FIG. 1 contains a main amplifier 10, that is formed by two operational amplifiers 11 and 12 connected in cascade. Of the external connections to the operational amplifiers only the feedback resistors 13 and 14 respectively are represented, that connect the output of the respective operational amplifier with the inverting input. The non-inverting input of each of the two operational amplifiers is connected to ground. In addition, the output of the first operational amplifier 11 is connected with the inverting input of the second operational amplifier 12 by way of a resistor 15. The inverting input of the first operational amplifier 11 is connected by way of a resistor 16 to the input terminal 17, to which is applied the output signal of the measuring transducer, that is to be linearized by the non-linear d.-c. amplifier. The output of the second operational amplifier is connected with the output terminal 18 of the circuit arrangement.

The inverting input of the first operational amplifier 11 thus represents the input 19 of the main amplifier 10 and the output of the second operational amplifier 12 forms the output 20 of the main amplifier 10.

The output 20 of the main amplifier 10 is connected with the amplifier input 19 over a number of parallel branch circuits $A_1$–$A_n$, of which only the first branch circuit $A_1$ and the last branch circuit $A_n$ are represented in FIG. 1. These branch circuits all have the same configuration; the configuration of the branch circuit $A_1$ only will therefore be described. This branch circuit contains a non-linear operational amplifier element, consisting of an operational amplifier 21 with external connections that give the operational amplifier element a non-linear response. Among these external connections are two diodes 22 and 23, of which the diode 22 connects the output of the operational amplifier 21 with its inverting input, while the diode 23 is in series with the feedback resistor 24 in the negative feedback circuit that leads from the output of the operational amplifier to its inverting input. This circuit arrangement forms what is called a precision rectifier, that provides the response of an ideal diode. The non-inverting input of the operational amplifier 21 is grounded. The inverting input is connected on the one hand by way of a resistor 25 with the output terminal 20 of the main amplifier 20 and on the other hand by way of a resistor 26 with a circuit point 27 that is at a reference potential $-U_{Ref1}$. The resistors 25 and 26 thus form a voltage divider that is connected between the output 20 of the main amplifier and the circuit point 20 held at the negative reference potential, and the tapping of which is connected with the inverting input of the operational amplifier 21.

The output of the non-linear operational amplifier element, that is formed by the junction between the feedback resistor 24 and the diode 23, is connected by way of a summing resistor 28 with the input 19 of the main amplifier 10. This input, to which the summing resistors of all the branch circuits and also the resistor 16 are connected, thus forms a summing point for the currents applied to the main amplifier 10.

To this summing point 19 there is also connected by way of a further summing resistor 30, the tapping of an adjustable voltage divider 29 that is connected between ground and a direct voltage $U_{Ref0}$.

The branch circuits $A_1$-$A_n$ containing the non-linear operational amplifier elements are thus connected in parallel with one another between the output 20 and the input 19 of the main amplifier 10. Because of the construction of the main amplifier from two operational amplifiers connected in cascade, the signal at the output 20 alters in the same sense as the signal applied to the input. It is assumed that the input signal $U_e$ assumes only positive values, so that the output voltage $U_a$ is always positive.

The mode of operation of this non-linear d.-c. amplifier will be explained with reference to FIG. 2, which shows the amplifier characteristic, that is, the variation of the output voltage $U_a$ as a function of the input voltage $U_e$.

The reference voltages $U_{Ref1}$-$U_{Refn}$ applied to the terminals 27 of the various branch circuits $A_1$-$A_n$ are all negative, so that the operational amplifier elements, behaving as ideal diodes, of all the branch circuits are blocked when the output voltage $U_a$ has zero value. In the characteristic diagram of FIG. 2 it is assumed that this is the case for zero value of the input voltage $U_e$.

In the initial condition all of the branch circuits $A_1$-$A_n$ are therefore interrupted and are thus ineffective in the operation of the amplifier. When the input voltage $U_e$ rises from zero value in the positive direction, the output voltage $U_a$ alters in proportion thereto, corresponding to segment I of the characteristic of FIG. 2, the slope of which is determined by the resistance 16 in conjunction with the internal construction of the amplifier 10.

When the output voltage $U_a$ attains a definite value $U_{a1}$, that depends upon the values of the resistors 25, 26 of the branch circuit $A_1$ and the reference voltage $-U_{Ref1}$ applied to the terminal 27 of this branch circuit, the non-linear operational amplifier element of this branch circuit commences to become conductive, so that it begins to feed a current into the summing point 19 by way of the summing resistance 28. The slope of the amplifier characteristic thus alters, so that the further rise of the output voltage $U_a$ follows in accordance with segment II of the amplifier characteristic.

When the output voltage $U_a$ attains a value $U_{a2}$, a further branch circuit becomes conductive, and the rise of the amplifier characteristic now corresponds to the segment III of FIG. 2.

In this manner an amplifier characteristic with n discontinuities can be obtained, that approximately reproduces the desired characteristic. The discontinuities may be selected by the values of the resistors 25, 26 and the adjustment of the reference voltages $U_{Ref1}$-$U_{Refn}$ of the various branch circuits $A_1$-$A_n$, and the slopes of the various segments of the amplifier characteristic are adjustable by the values of the resistors 24, 25 and of the summing resistor 28, so that with the circuit represented any arbitrary characteristic curve may be approximated, with the limitation that only a diminishing slope, such as is shown in FIG. 2, is possible.

As is to be understood from the preceding description in conjunction with FIG. 2, this circuit displays the characteristic that the positions of the discontinuities in the characteristic depend only upon particular values of the output voltage $U_a$, independent of the values of the input voltage $U_e$, at which these values of the output voltage $U_a$ are obtained.

The advantageous operation thus produced will be explained with reference to FIGS. 7 and 8.

Figure 7:
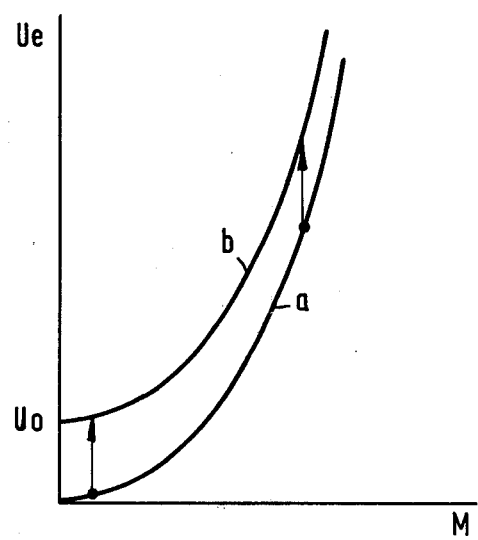
FIGS. 7 and 8 show different characteristics to illustrate the advantageous effects produced by the use of the invention.
Figure 8:
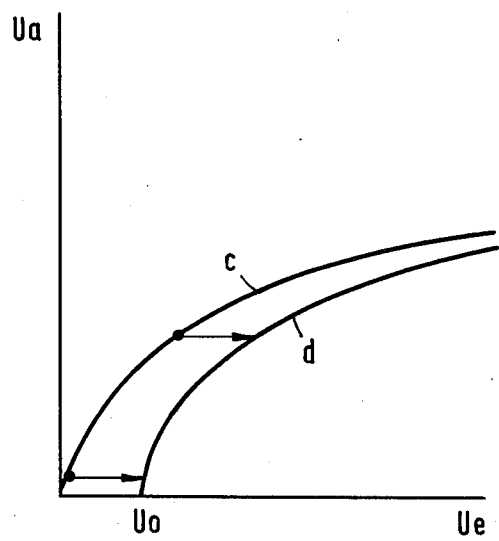

The diagram of FIG. 7 shows the calibration curve a of a measuring transducer, that is, the output voltage of the measuring transducer as a function of the measured magnitude M. This voltage likewise forms the input voltage $U_e$ of the non-linear d.-c. amplifier. This calibration curve is curved; the voltage $U_e$ is thus not in a linear relation with the measured magnitude M. In order that a voltage linearly dependent upon the measured magnitude M may be obtained, the d-c. amplifier connected to the output of the measuring transducer must have an amplifier characteristic, such as is represented at c in FIG. 8; this characteristic is the inverse of mirror function of the calibration curve a. This characteristic may in the previously described manner be approximated by adjustment of the discontinuities and slopes of the amplifier characteristic of the circuit arrangement of FIG. 1.

It is now assumed that the amplifier is connected to a measuring transducer that has a calibration curve corresponding to the curve b of FIG. 7. This curve corresponds to a parallel displacement of the curve a by a constant amount (offset factor) in the direction of the ordinates. The output voltage of the measuring transducer then has, at zero value of the measured quantity, not the value zero, but a value $U_o$. In order to suppress this offset factor in the output voltage $U_a$, so that this likewise assumes zero value when the measured quantity is zero, the amplifier characteristic of FIG. 8 must be shifted parallel to itself, as is indicated by the arrows.

In the circuit arrangement of FIG. 1, this parallel shift may result simply by appropriate adjustment of the potentiometer 29, so that this supplies to the summing point 19 an offset current that shifts the origin of the characteristic to the point $U_o$. As a result of the fact set out above, that the discontinuities of the characteristic do not depend upon the values of the input voltage $U_e$, but upon the values of the output voltage $U_a$, the characteristic retains its form unchanged when thus shifted, so that the linear relation between the output voltage $U_a$ and the measured quantity is maintained.

Figure 3:
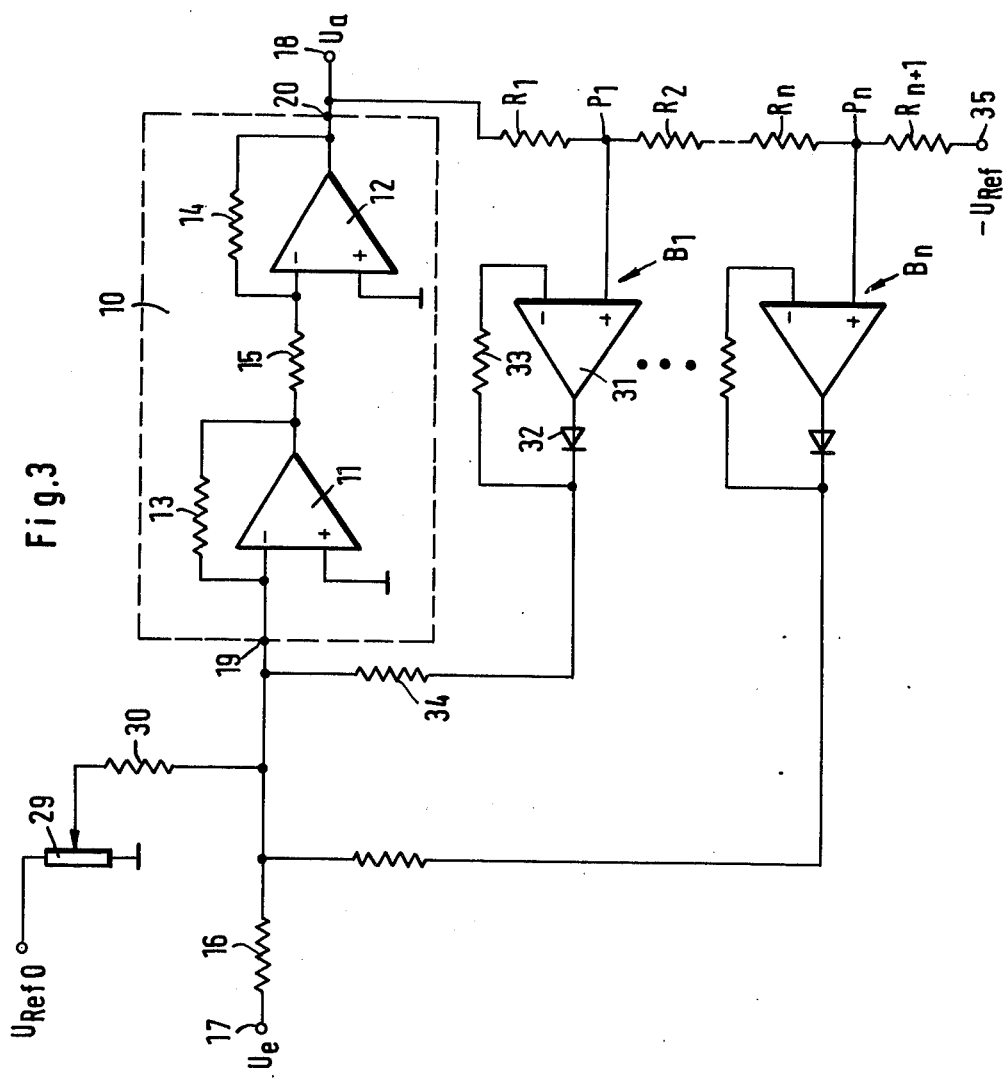
FIG. 3 shows another embodiment of non-linear d.-c. amplifier.

FIG. 3 shows another embodiment of non-linear d.-c. amplifier for producing an amplifier characteristic with increasing slope, such as is shown in FIG. 4.

As will be seen by comparison with FIG. 1, the formation of the main amplifier 10 by the operational amplifiers 11, 12 and the resistors 13, 14, 15, the connection of the main amplifier 10 with the input terminal 17 by way of the resistor 16, with the output terminal 18 and with the circuit 29, 30 for offset compensation are retained unaltered. On the other hand the circuit of FIG. 3 differs from that of FIG. 1 in respect of the configuration of the branch circuits $B_1$-$B_n$ containing non-linear operational amplifier elements, of which only the first branch circuit $B_1$ and the last branch circuit $B_n$ are represented.

Since these branch circuits all have the same configuration, once again only the construction of the branch circuit $B_1$ will be described. It contains an operational amplifier 31 which is made non-linear by its external connections. For this purpose there is connected after the operational amplifier a diode 32, which is in series with the feedback resistor 33 in the feedback circuit leading to the inverting input of the amplifier. The junction point between the feedback resistor 33 and the diode 32 forms the output of the non-linear operational amplifier element, that is connected by way of a summing resistor 34 with the summing point at the input 19 of the main amplifier 10.

Between the output 20 of the main amplifier 10 and a terminal 35 held at a negative reference voltage $-U_{Ref}$ there is connected a voltage divider chain of resistors $R_1$, $R_2$–$R_n$, $R_{n+1}$. The non-inverting input of the operational amplifier 31 is connected with the first tapping point $P_1$ of the voltage divider chain. In a similar manner the non-inverting inputs of the operational amplifiers of the remaining branch circuits $B_2$–$B_n$ are connected with the successive tapping points $P_2$–$P_n$ of the voltage divider chain.

The mode of operation of this circuit arrangement corresponds completely with the previously described operation of the circuit arrangement of FIG. 1, with the difference that the slope of the successive segments I, II, III of the amplifier characteristic does not diminish, but increases (FIG. 4).

The circuit arrangement possesses all the advantages that have previously been explained with reference to FIGS. 7 and 8, in particular, it is possible to compensate the offset factor by appropriate adjustment of the potentiometer 29 without noticeable impairment of the overall linearity and to take into account alterations of the sensitivity factor by adjustment of the gain of the main amplifier 10.

FIG. 5 shows a non-linear d.-c. amplifier in which the circuit arrangements of FIGS. 1 and 3 are combined, so that it is possible to obtain amplifier characteristics with changing slopes and inflexion points such as are shown by way of example in FIG. 6.

The construction of the main amplifier 10 with the operational amplifiers 11, 12 and the connection of the main amplifier with the input terminal 17 and the output terminal 18 are again retained unchanged. The additional resistors 37 and 38 which connect the non-inverting inputs of the operational amplifiers 11, 12 to ground represent a known means for improving the temperature performance of the operational amplifiers.

In this case there are provided two groups of branch circuits $C_1$–$C_n$ and $D_1$–$D_n$, of which in each case only the first branch circuit $C_1$ and $D_1$ is illustrated. The branch circuits C correspond in principal to circuits $A_1$–$A_n$ of FIG. 1 and thus yield an amplifier characteristic of diminishing slope as they respond in succession. The branch circuits D correspond in principle to circuits $B_1$–$B_n$ of FIG. 3 and yield an amplifier characteristic of increasing slope, as they respond in succession. If the circuit is arranged so that first all the branch circuits C and then all branch circuits D respond in sequence, a characteristic of the kind shown at m in FIG. 6 is obtained, in which the slope at first diminishes and then increases again after passing through a point of inflexion. If on the other hand first all the branch circuits D respond, and then all the branch circuits C, the amplifier characteristic has approximately the form shown at n in FIG. 6. More complex forms of amplifier characteristic can also be obtained.

The circuit arrangement of FIG. 5 contains in addition a series of further means that improve the behaviour of the circuit and expand the possible applications of the circuit.

As for the branch circuits A of FIG. 1, each branch circuit C contains a non-linear operational amplifier element that is connected as a precision rectifier and consists of an operational amplifier 41, diodes 42 and 43 and a feedback resistor 44 connecting the output with the inverting input. The inverting input is further connected by way of a resistor 45 with the output 20 of the main amplifier and also by way of a resistor 46 with the tapping of an adjustable potentiometer 47 that serves to adjust the reference voltage for the respective branch circuit. The non-inverting input of the operational amplifier 41 is connected to ground by way of a temperature-performance improving resistor 48. Naturally, an individual potentiometer 47 is provided for each of the branch circuits $C_1$–$C_n$, for separate adjustment of the respective reference voltages.

Each of the branch circuits D contains, like each branch circuit B in FIG. 3, a non-linear operational amplifier element including an operational amplifier 51, a diode 52 and a feedback resistor 53 leading to the inverting input. The non-inverting input of the operational amplifiers of the branch circuits $D_1$–$D_n$ are connected with the tappings $P_1$–$P_n$ of a voltage divider chain that consists of series-connected resistors $R_1$, $R_2$–$R_{n+1}$ and is connected between the output 20 of the main amplifier 10 and a terminal 55 held at a reference voltage.

As compared with the circuit arrangements of FIGS. 1 and 3 the following additional features are found:

The summing resistors of the branch circuits are not connected directly to the outputs of the non-linear operational amplifier elements, but to the tappings of adjustable voltage dividers, that are connected in turn to the outputs of the non-linear operational amplifier elements; this provides an additional possibility of adjusting the amplifier characteristic.

In each branch circuit there are provided a plurality of voltage dividers with associated summing resistors, and the summing resistors are combined into groups, each of which contains a summing resistor of several different branch circuits; there are also provided electronic switches with which respective groups of summing resistors can be connected with the input 19 of the main amplifier. It is thus possible to change-over the non-linear amplifier to different pre-programmed amplifier characteristics.

In each output circuit of each non-linear operational amplifier element there is connected a diode which results in a rounding-off of the discontinuities produced by the respective branch circuit.

In the input circuit of each non-linear operational amplifier element there is connected a diode for compensating the temperature dependency resulting from the rounding-off diode.

In parallel with the non-linear branch circuits $C_1$–$C_n$, $D_1$–$D_n$ there is connected between the output and the input of the main amplifier a branch circuit E including a linear operational amplifier element. This branch circuit E makes it possible to adjust the gain of the main amplifier for matching to different sensitivity factors of transducers.

It may be seen from FIG. 5 how these measures are realised:

To the output of the non-linear operational amplifier element of the branch circuit C, there are connected in parallel, each by way of a respective diode $61_a$–$61_k$, a plurality of adjustable potentiometers $60_a$–$60_k$. The diodes $61_a$–$61_k$ are the rounding-off diodes. In the connection between the inverting input of the operational amplifier 41 and the tapping of the voltage divider 47 there is connected a further diode 62 for temperature compensation of the rounding-off diodes. The tapping of each potentiometer $60_a$–$60_k$ is connected with one terminal of a respective summing resistor $63_a$–$63_k$.

In a similar manner there are connected in parallel to the output of the non-linear operational amplifier element of the branch circuit $D_1$ a plurality of adjustable potentiometers $70_a$–$70_k$, each by way of a rounding-off diode $71_a$–$71_k$. In this case the temperature compensation is effected by a diode 72, that is connected in series with the resistor $R_1$ in the voltage divider chain. The tapping of each potentiometer $70_a$–$70_k$ is connected with one terminal of a respective summing resistor $73_a$–$73_k$.

The circuit arrangement E contains a linear operational amplifier 81 with a feedback resistor 82 that connects its output with the inverting input, which is also connected by way of a resistor 83 with the output 20 of the main amplifier 10. In the connection between the non-inverting input and earth there is connected a resistor 84 for improving the temperature performance. To the output of the operational amplifier 81 there are connected in parallel a plurality of adjustable potentiometers $85_a$–$85_k$, the tappings of which are each connected with one terminal of a respective summing resistor $86_a$–$86_k$.

Finally there are provided for offset compensation a plurality of potentiometers $29_a$–$29_k$ the tapping of each being connected with one terminal of a respective summing resistor $30_a$–$30_k$.

The summing resistors $30_a$, $63_a$, $73_a$, $86_a$ and the corresponding summing resistors of the remaining branch circuits $C_2$–$C_n$, $D_2$–$D_n$ are connected into a group, and the junction point $90_a$ of this group is connected to the drain of a field-effect transistor $91_a$, of which the source is connected with the summing point at the amplifier input 19 and of which the gate electrode is connected by way of a resistor $92_a$ to a negative voltage $-U$. The other summing resistors of the branch circuits are connected into groups in a similar manner and each group is connected with a respective field-effect transistor, as is shown in FIG. 5 only for the summing resistors $30_k$, $63_k$, $73_k$, $86_k$ and the field-effect transistor $91_k$ with its bias resistor $92_k$.

The negative potential applied to the gate electrodes holds the field-effect transistors $91_a$–$91_k$ normally turned off. With the aid of a selector switch 93, the gate electrode of any one of the field-effect transistors can be taken to ground potential so that the respective field-effect transistor is turned on and connects the group of summing resistors with which it is associated to the amplifier input. The non-linear d.-c. amplifier then has an amplifier characteristic that is determined by the respective summing resistors and by the state of adjustment of the respective potentiometers. The amplifier can thus be changed over to any of a plurality of pre-set amplifier characteristics by actuation of the selector switch 9.

By means of the potentiometers $85_a$–$85_k$ of the branch circuit E the gain of the amplifier 10 can be adjusted for each amplifier characteristic; on changing over to another amplifier characteristic this gain is automatically changed over at the same time. This manner of gain adjustment provides the advantage that the temperature compensation effected by the resistors 37, 38, 48, 84 is practically unaffected by changes in gain.

In a similar manner, the current for connecting the offset factor may be separately adjusted for each amplifier characteristic with the help of the potentiometers $29_a$–$29_k$, and the selection of the offset compensation is likewise effected automatically together with the selection of the amplifier characteristic.

What we claim is:

1. A non-linear direct current amplifier comprising:
   a main amplifier for receiving an input signal at an input port and generating a corresponding output signal at an output port;
   a voltage divider connected between the output port of said main amplifier and a reference potential and having a plurality of voltage tap-off points; and
   a plurality of non-linear feedback operational amplifiers connected between said voltage divider and the input port of said main amplifier, each non-linear feedback operational amplifier having a first input connected to at least one of said voltage tap-off points, an output connected to the input port of said main amplifier through a feedback diode and a particular summing resistor, and a second input connected to said output through a feedback resistor and said feedback diode to define a feedback loop for said feedback amplifier.

2. The non-linear current amplifier of claim 1 wherein the first input of said non-linear feedback operational amplifiers is the non-inverting input of said amplifiers.

3. The non-linear direct current amplifier of claim 1 including means for connecting the input of a linear operational amplifier circuit to the output port of said main amplifier and for connecting the output of said linear operational amplifier circuit to at least one voltage divider, said divider having a tap point connected to the input port of the main amplifier through a summing resistor.

4. The non-linear direct current amplifier of claim 1 including means for connecting the input point of the main amplifier to the tap point of a voltage divider fed from a voltage source, to compensate an offset factor.

5. The non-linear direct current amplifier of claim 1 wherein said main amplifier includes a first and second component operational amplifier, the first component amplifier including an inverting input for defining the input port of said main amplifier and an output for connection to an input of said second component amplifier, said second component amplifier having an output for defining the output port of said main amplifier.

6. A non-linear direct current amplifier comprising:
   a main amplifier for receiving an input signal at an input port and generating a corresponding output signal at an output port;
   a series voltage divider connected between the output port of said main amplifier and a particular reference potential and having a plurality of series voltage tap-off points;
   a plurality of non-linear first feedback operational amplifiers connected between said series voltage divider and the input port of said main amplifier, each non-linear first feedback operational amplifier having a first input connected to at least one of said series voltage tap-off points, an output connected to the input port of said main amplifier through a feedback diode and a summing resistor, and a second input connected to said output through a feedback resistor and said feedback diode to define a feedback loop for the feedback amplifier;

a plurality of parallel voltage dividers, each divider connected in parallel between the output port of said main amplifier and an associated reference voltage to define a corresponding parallel voltage tap-off point; and a plurality of non-linear second feedback operational amplifiers, each amplifier having one input connected to a parallel voltage tap-off point of at least one of said parallel voltage dividers, an output connected to the input port of said main amplifier through at least a feedback diode and a summing resistor, and another input connected to the output of said second feedback amplifier through a feedback resistor and said feedback diode of said amplifier to define a feedback loop for the amplifier.

7. The non-linear direct current amplifier of claim 6 including means for connecting the common point of connection between the feedback diode and the feedback resistor of each of said first feedback amplifiers and said second feedback amplifiers to at least one voltage divider, said at least one divider having its tap point connected to the input port of said main amplifier through an associated summing resistor.

8. The non-linear direct current amplifier of claim 6 including means for connecting the point of connection between the feedback diode and the feedback resistor of each of said first feedback amplifiers and said second feedback amplifiers in parallel with a plurality of additional voltage divider, means for connecting the tap point of each of said additional dividers to one terminal of an associated summing resistor, means for grouping said associated summing resistors of particular additional dividers and for providing a common connection within each group between other terminals of the summary resistors of the group, and means for connecting the common other terminal connection of each group to the input port of the main amplifier through an associated switch.

9. The non-linear direct current amplifier of claim 8 wherein the associated switch for each group includes a semi-conductor switching device.

10. The non-linear direct current amplifier of claim 8 wherein the additional voltage dividers are adjustable.

11. The non-linear direct current amplifier of claim 6 including means for connecting the input of a linear operational amplifier circuit to the output port of said main amplifier and for connecting the output of said linear operational amplifier circuit to at least one voltage divider, said divider having a tap point connected to the input port of the main amplifier through a summing resistor.

12. The non-linear direct current amplifier of claim 6 including means for connecting the input port of the main amplifier to the tap point of a voltage divider fed from a voltage source, to compensate an offset factor.

13. The non-linear direct current amplifier of claim 6 wherein said main amplifier includes a first and a second component operational amplifier, the first component amplifier including an inverting input for defining the input port of said main amplifier and an output for connection to an input of said second component amplifier, said second component amplifier having an output for defining the output port of said main amplifier.

* * * * *